United States Patent
Kobayashi et al.

(10) Patent No.: US 7,026,190 B2
(45) Date of Patent: *Apr. 11, 2006

(54) METHOD OF MANUFACTURING CIRCUIT DEVICE

(75) Inventors: Yoshiyuki Kobayashi, Gunma (JP);
Noriaki Sakamoto, Gunma (JP); Kouji Seki, Gunma (JP); Kouji Takahashi, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 288 days.

This patent is subject to a terminal disclaimer.

(21) Appl. No.: 10/211,758

(22) Filed: Aug. 2, 2002

(65) Prior Publication Data

US 2003/0040138 A1 Feb. 27, 2003

(30) Foreign Application Priority Data

Aug. 27, 2001 (JP) ............................. P. 2001-255474

(51) Int. Cl.
*H01L 21/44* (2006.01)
*H01L 21/48* (2006.01)
*H01L 21/50* (2006.01)

(52) U.S. Cl. ............... 438/114; 438/107; 438/108; 438/110; 438/111; 438/112; 438/113

(58) Field of Classification Search ......... 438/107–116
See application file for complete search history.

(56) References Cited

U.S. PATENT DOCUMENTS

| | | | | |
|---|---|---|---|---|
| 5,890,644 A | * | 4/1999 | Ball | 228/44.7 |
| 5,900,676 A | * | 5/1999 | Kweon et al. | 257/787 |
| 6,238,952 B1 | * | 5/2001 | Lin | 438/110 |
| 6,451,627 B1 | * | 9/2002 | Coffman | 438/111 |
| 6,531,370 B1 | * | 3/2003 | Sakamoto et al. | 438/343 |
| 6,545,364 B1 | * | 4/2003 | Sakamoto et al. | 257/773 |
| 6,548,328 B1 | * | 4/2003 | Sakamoto et al. | 438/121 |
| 6,562,660 B1 | * | 5/2003 | Sakamoto et al. | 438/124 |
| 6,596,564 B1 | * | 7/2003 | Sakamoto et al. | 438/118 |
| 6,624,511 B1 | * | 9/2003 | Sakamoto et al. | 257/734 |
| 6,706,547 B1 | * | 3/2004 | Sakamoto et al. | 438/33 |
| 6,715,659 B1 | * | 4/2004 | Ball | 228/4.5 |
| 2002/0133943 A1 | * | 9/2002 | Sakamoto et al. | 29/846 |

* cited by examiner

*Primary Examiner*—Maria F. Guerrero
(74) *Attorney, Agent, or Firm*—Fish & Richardson P.C.

(57) ABSTRACT

Wire bonding is performed efficiently by pressing circumference end of a block of a conductive foil by a clamper, and by performing wire bonding of a circuit element of a mounting portion in the block and the conductive pattern in a lump. At a time of wire bonding, oxidation of the conductive foil is prevented by blowing nitrogen gas to the conductive foil from paths and provided at the clamper.

17 Claims, 13 Drawing Sheets

METHOD OF MANUFACTURING CIRCUIT DEVICE

BACKGROUND OF THE INVENTION

The present invention relates to a method of manufacturing a circuit device, particularly to a method of manufacturing a circuit device of thin type not needing a supporting substrate.

Up to now, since a circuit device set to an electronic instrument is used for a portable telephone, a portable computer, and the like, miniaturization, thin type, and light weight are required.

For example, describing an example of semiconductor device as a circuit device, there is a package type semiconductor device sealed with a usual transfer molding as a general semiconductor device up to now. The semiconductor device is molded on a printed circuit board PS as shown in FIG. 13.

In the package type semiconductor device, periphery of a semiconductor chip 2 is covered with a resin layer 3, and a lead terminal 4 for an external connection is led out from a side portion of the resin layer 3.

However, in the package type semiconductor device 1, the lead terminal 4 comes out from the resin layer 4, and size of the whole is too large to satisfy the request for miniaturization, thin type, and light weight.

Because of that, each company develops various kind of structure with competition to realize miniaturization, thin type, and light weight, and nowadays a wafer scale CSP similar in size as size of a chip, or a CSP some larger in size than the chip size, they are called CSP (chip size package), is developed.

FIG. 14 shows a CSP 6 adopting a glass epoxy substrate 5 as the supporting substrate and some larger than the chip size. Here, it is described as that a transistor chip T is molded on the glass epoxy substrate 5.

A first electrode 7, a second electrode 8, and die pad 9 are formed at the front face of the glass epoxy 5, and the rear face, a first rear face electrode 10 and a second rear face electrode 11 are formed. The first electrode 7 and the first rear face electrode 10, and the second electrode 8 and the second rear face electrode 11 are connected electrically through through-holes TH. The bare transistor chip T is fixed at the die pad 9, the emitter electrode of the transistor chip T and the first electrode 7 are connected through a metal fine wire 12, and the base electrode of the transistor chip T and the second electrode 8 are connected through a metal fine wire 12. Further, the resin layer 13 is provided on the glass epoxy substrate 5 so as to cover the transistor chip T.

The CSP 6 has merits that extending structure from the chip T to the rear face electrodes 10 and 11 for external connection is simple and it is produced in low cost differing from the wafer scale CSP though the glass epoxy substrate 5 is adopted.

Further, the CSP 6 is mounted on the printed circuit board PS as shown in FIG. 13. On the printed circuit board PS, electrodes and wiring forming an electric circuit are provided, and the CSP 6, the package type semiconductor device 1, chip resistors CR, or chip capacitors CC are connected electrically and fixed.

The circuit constructed by the printed circuit board is attached in various kinds of sets.

Next, a method of manufacturing the CSP will be described referring FIGS. 15A to 15D and FIG. 16.

First, the glass epoxy substrate 5 is provided for a base material (supporting substrate), Cu foils 20 and 21 are pressure bonded to both faces of the substrate through insulating adhesive. (See FIG. 15A)

Next, resist 22 having etching resistance property is covered on the Cu foils 20 and 21 corresponding to the first electrode 7, the second electrode 8, die pad 9, the first rear face electrode 10, and the second rear face electrode 11, and patterning the Cu foils 20 and 21 are performed. The patterning maybe performed separately at front and rear faces. (See FIG. 15B)

Next, holes for the through-holes TH are formed at the epoxy substrate using drill and laser, and the through-holes TH are formed by plating the holes. By the through-holes, the first electrode 7 and the first rear face electrode 10, and the second electrode 8 and the second rear face electrode 10 are connected electrically. (See FIG. 15C)

Further, although not shown in the figures, Au plating is performed to the first electrode 7 and the second electrode 8 to be bonding posts, Au plating is performed to the die-pad becoming die-bonding post, and the transistor chip is die-bonded.

Finally, the emitter electrode of the transistor chip T and the first electrode 7, and the base electrode of the transistor chip T and the second electrode 8 are connected through the metal fine wires 12, and covered with the resin layer 13. (See FIG. 15D)

By the above method of manufacturing, electric elements of CSP type adopting the supporting substrate 5 are completed. The method of manufacturing is similar as by adopting a flexible sheet as a supporting substrate.

On the other hand, a method of manufacturing adopting a ceramic substrate is shown in flow of FIG. 16. After preparing a ceramic substrate functioning as a supporting substrate, a through-hole is formed, after that, electrodes of front and rear faces are printed using conductive paste, and the ceramic substrate is sintered. After that, although the method is the same as the method of manufacturing of FIG. 15 till the resin layer of the method of manufacturing, there is a problem that molding using a die can not be performed because the ceramic substrate is very fragile and is easily broken differing from a flexible sheet and a glass epoxy substrate. Because of that, sealing resin is potted, after hardening, polishing flattening the sealing resin is performed, and finally the substrate is separated individually using a dicing device.

Although the transistor chip T, the connecting member (the first electrode 7, the second electrode 8, the die pad 9, the first rear face electrode 10, the second rear face electrode 11, and metal fine wire 12) and the resin layer 13 are required component elements on connecting to the outside and protecting the transistor in FIG. 14, it is difficult to provide circuit elements realizing miniaturization, thin shape, and light weight with such the component elements.

The glass epoxy substrate 5 being the supporting substrate is needless originally as described above. However, on the method of manufacturing, the substrate is adopted as a supporting substrate to bond the electrodes, so it is not possible to remove the glass epoxy substrate 5.

Because of that, by adopting the glass epoxy substrate 5, cost rises, further because the glass epoxy substrate 5 is thick, the circuit elements become thick so that there is a limit for miniaturization, thin shape, and light weight.

Further, through-hole forming process connecting electrode of both faces is always indispensable at the glass epoxy substrate and ceramic substrate, and there is a problem not fitting to mass production because manufacturing process becomes long.

SUMMARY OF THE INVENTION

The invention is carried out in view of many above-mentioned problems, and the method of manufacturing the circuit device of the invention comprises: a process preparing a conductive foil, forming a conductive pattern by forming a shallower isolation trench than thickness of the conductive foil at the conductive foil of area except the conductive pattern forming at least plural mounting portions of circuit elements; a process fixing the circuit elements at the each mounting portion of the desired conductive pattern; a process providing the conductive pattern on a heat block, pressing periphery of the block of the conductive foil by a clamper, and performing wire-bonding between each circuit element of the block and the desired conductive pattern; a process covering the circuit element of each mounting portion in a lump, common-molding with insulation resin so as to fill into the isolation trench; a process removing whole rear face area of the conductive foil till the insulating resin is exposed; and a process separating the insulating resin at every mounting portion by dicing.

In the invention, the conductive foil forming the conducting pattern is a starting material, the conductive foil has supporting function till the insulating resin is molded, after molding the supporting substrate is needless by that the insulating resin has supporting function so as to solve the problems of the related art.

In the invention, by pressing the conductive foil once at every block by the clamper and by performing wire bonding between each circuit element in the block and the desired conductive pattern in a lump in the wire bonding process, many circuit devices are mass-produced and the problem of the related art are possible to solve.

Further in the invention, nitrogen gas is fed to the block continuously through the path provided at the clamper in the wire bonding process. Thus, it is prevented that the block consisting of Cu foil oxidizes.

DETAILED DESCRIPTION OF THE PREFERRED EMBODIMENT

First, a method of manufacturing a circuit device of the invention will be described in detail referring FIG. 1.

The method of manufacturing the circuit device of the invention includes a process preparing a conductive foil, forming a conductive pattern by forming a shallower isolation trench having shallower thickness than that of the conductive foil at the conductive foil of area except the conductive pattern forming at least plural mounting portion of circuit elements; a process fixing the circuit elements at the each mounting portion of the desired conductive pattern; a process providing the conductive pattern on a heat block, pressing periphery of the block of the conductive foil by a clamper, and performing wire bonding between each circuit element of the block and the desired conductive pattern; a process covering the circuit element of each mounting portion in a lump, common-molding with insulation resin so as to fill into the isolation trench; a process removing whole rear face area of the conductive foil till the insulating resin is exposed; and a process separating the insulating resin at every mounting portion by dicing.

Figure 1:
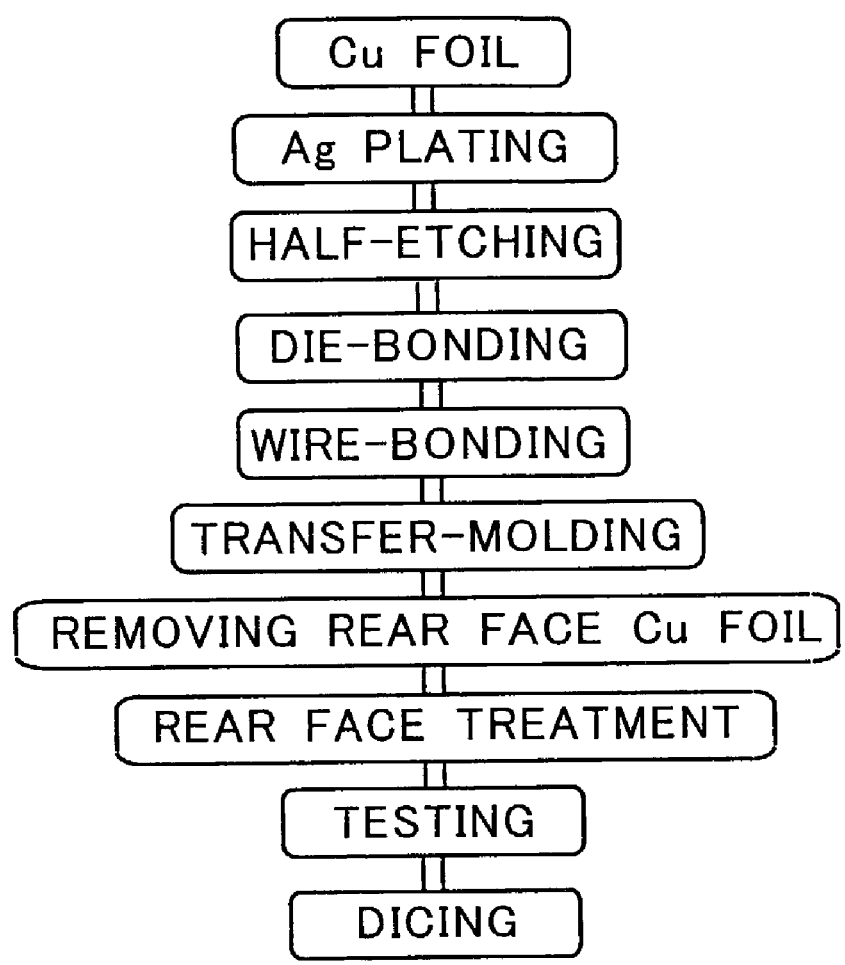
FIG. 1 is a view explaining a product flow of the invention.

In the flowchart shown in FIG. 1, a conductive pattern is formed by three flows: Cu foil; Ag plating; and half-etching. Mounting the circuit elements on each mounting portion and connection between the electrodes of the circuit elements and the conductive pattern are performed by two flows of die bonding and wire bonding. The common molding member performing molding a block providing plural mounting portions using one die cavity. In the flow of removing rear face Cu foil, whole area of the rear face of the conductive foil is etched until the insulating resin is exposed. In the flow of the rear face treatment, electrode treatment of the conductive pattern exposed at the rear face is performed. In the flow of testing, judge of quality and classing characteristic rank of the circuit elements attached in each mounting portion are performed. In the flow of dicing, separation to individual circuit element from the insulation resin by dicing.

Each process of the invention will be described below referring FIG. 2A to FIG. 12.

A first process of the invention is to form a conductive pattern 51 by providing a conductive foil 60, and by forming a isolation trench 61 having shallower thickness than that of the conductive foil 60 at the conductive foil 60 of area except a conductive pattern 51 forming at least many mounting portions of circuit elements 52 as shown in FIG. 2A to FIG. 4B.

Figure 2A:
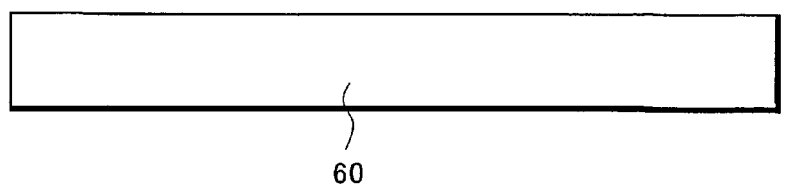
FIGS. 2A and 2B are views explaining a method of manufacturing a circuit device of the invention.

In the process, a sheet shaped conductive foil 60 is provided first as FIG. 2A. Material of the conductive foil 60 is selected in consideration of adhesion, bonding, and plating qualities of brazing material, then, conductive foil being Cu as a main material, conductive foil being Al as a main material, or conductive foil made of alloy of Fe—Ni is used.

Thickness of the conductive foil is desirable to be 10 μm to 300 μm considering the later etching, here Cu foil of 70 μm (2 ounces) is adopted. However, the thickness may be more than 300 μm or less than 10 μm fundamentally. As described later, the isolation trench 61 shallower than thickness of the conductive foil 60 may be formed.

The sheet shaped conductive foil 60 may be provided wound in roll shape, for example, with 45 mm to transfer to each process described later, and the rectangular shaped conductive foil 60 cut in the predetermined size may be provided to transfer to each process described later.

Figure 2B:
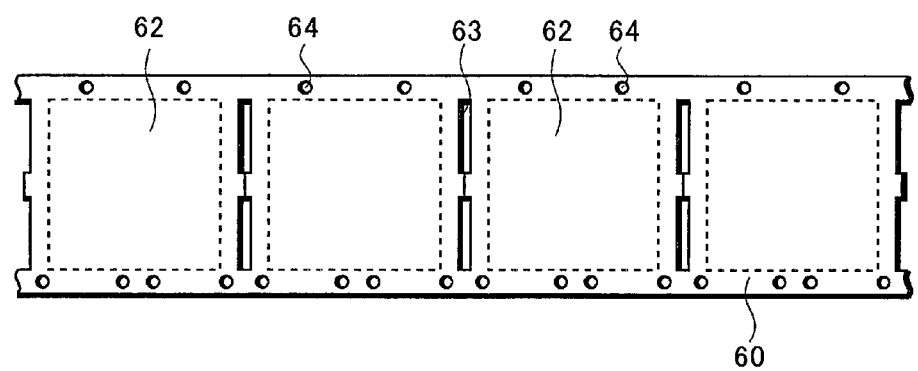

Concretely, four to five blocks 62 forming many mounting portions at the rectangle-shaped conductive foil 60 are lined separately as shown in FIG. 2B. Slits 63 are provided between each block 62, and absorb stress of the conductive foil 60 generating at heating process in the molding process. Index holes 64 are provided at end portions of upper and lower sides of the conductive foil 60 with certain space to use for positioning at each process.

Continuously the conductive pattern 51 formed.

Figure 3:
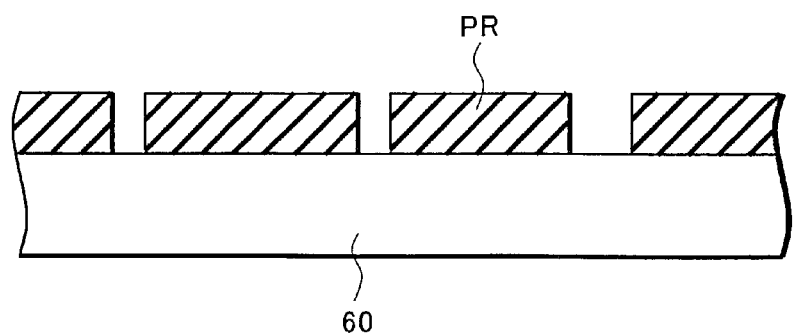
FIG. 3 is a view explaining a method of manufacturing a circuit device of the invention.

A photo resist (etching mask resistance) PR is formed on the Cu foil 60 as shown in FIG. 3, and the photo resist PR is patterned so that the conductive foil 60 except area becoming the conductive pattern 51 is exposed. The conductive foil 60 is etched selectively through the photo resist PR as shown in FIG. 4A.

Figure 4A:
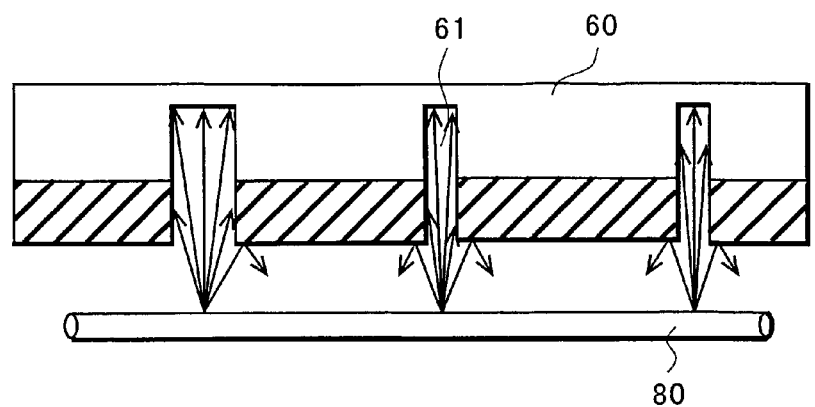
FIGS. 4A and 4B are views explaining a method of manufacturing a circuit device of the invention.

In the process, in order to make depth of the isolation trench 61 formed by etching uniform and accurate, etchant is showered from a supplying tube 80 of etchant provided at lower side of the conductive foil 60 facing the opening portion of the isolation trench 61 to lower side as shown in FIG. 4A. As the result, since a part of the isolation trench 61 applied with etchant is etched and the etchant is discharged immediately without making liquid accumulation in the isolation trench 61, depth of the isolation trench 61 is controlled by etching process time so as to form a uniform and accurate isolation trench 61. Ferric chloride or cupric chloride is adopted for etchant.

Figure 4B:
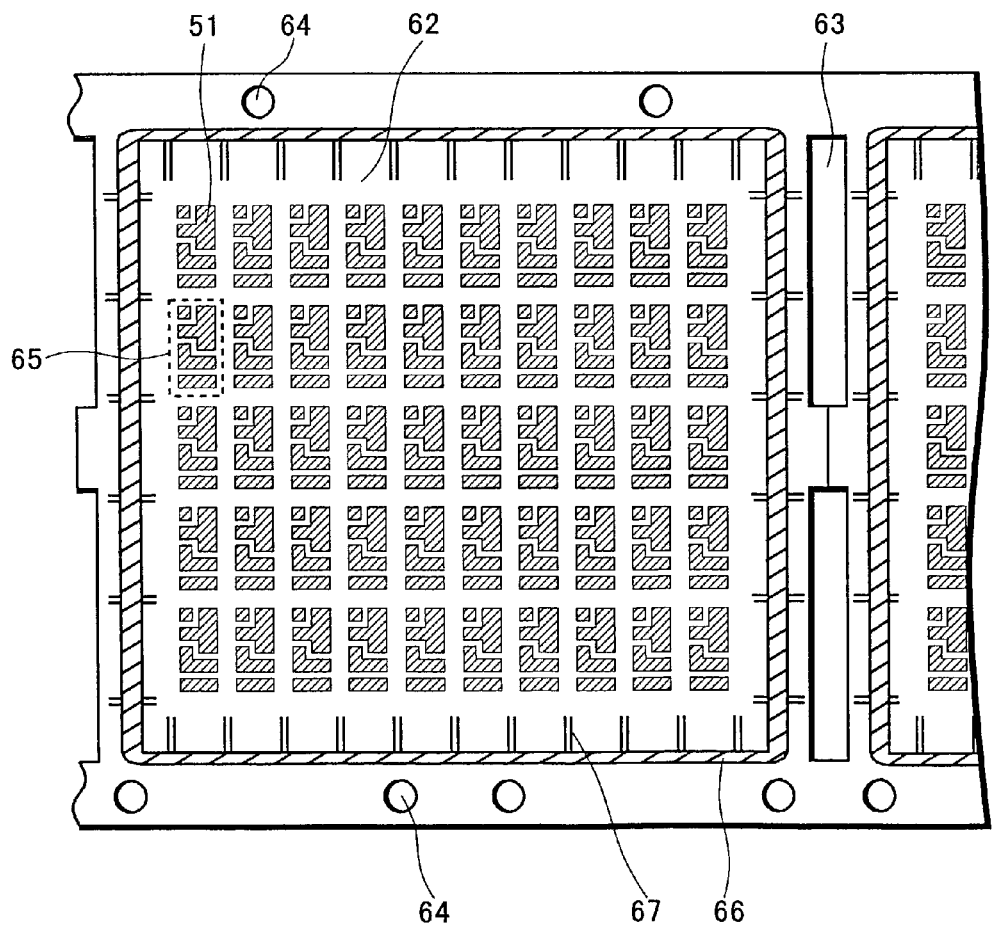

A concrete conductive pattern 51 is shown in FIG. 4B. The figure is a view enlarging one of the blocks 62 shown in FIG. 2B. An area surrounded by dotted lines is a mounting portion 65 including the conductive pattern 51, and many mounting portions 65 are arranged in matrix shape of 5 rows and 10 columns at one block 62 so as to provide the same conductive pattern 51 at every mounting portion 65. A frame shaped pattern 66 is provided, and positioning marks 67 at dicing are provided separately inside therefrom at periphery of each block. The frame shaped pattern 66 is used for fixing to a molding die, and has operation reinforcing the insulating resin 50 after rear face etching the conductive foil 60.

Figure 5A:
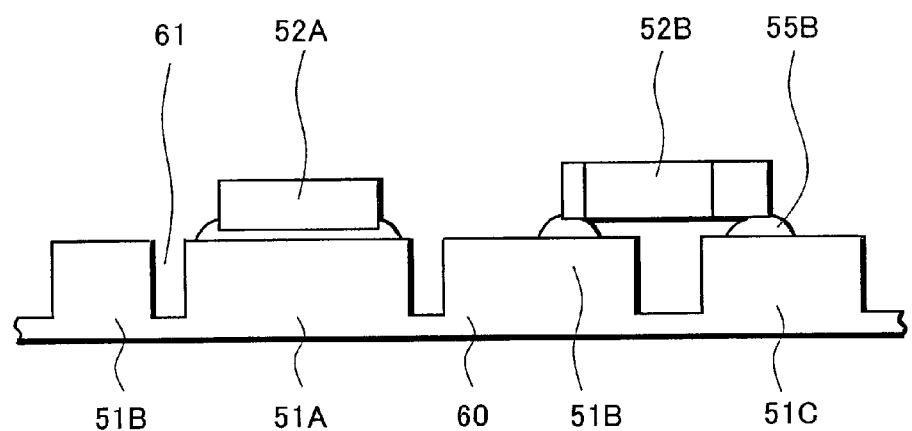
FIGS. 5A and 5B are views explaining a method of manufacturing a circuit device of the invention.
Figure 5B:
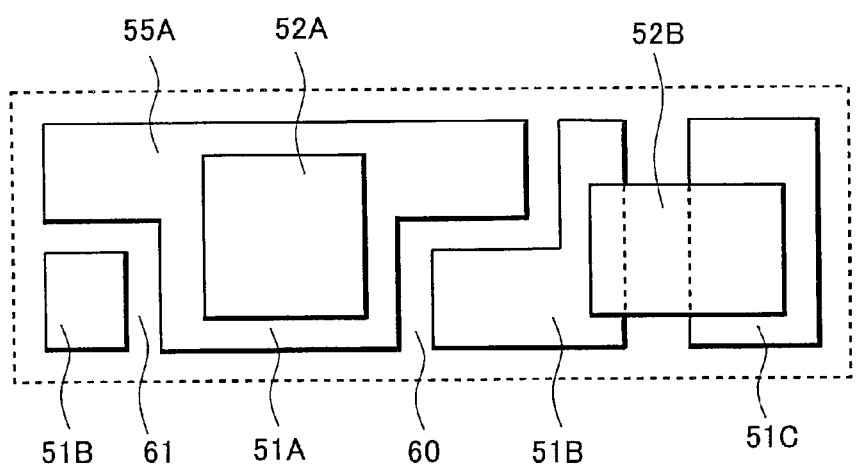
Figure 6A:
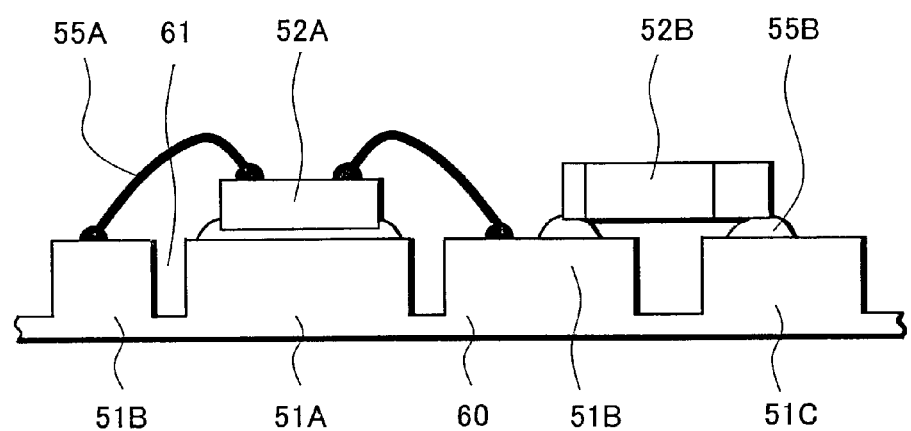
FIGS. 6A and 6B are views explaining a method of manufacturing a circuit device of the invention.
Figure 6B:
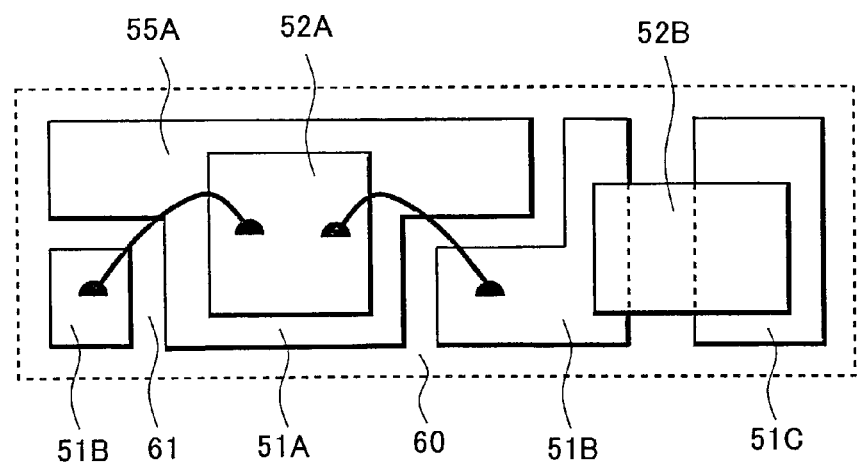

A second process of the invention is to fix the circuit elements 52 at each mounting portion of the desired conductive pattern 51 as shown in FIGS. 5A and 5B.

The circuit elements 52 are semiconductor element such as transistor, diode, IC chip, and passive elements such as chip capacitor, chip resistor, and the like. Semiconductor elements of facedown such as CSP, BGA, and the like can be mounted though thickness of the device becomes thick.

Here, a bare transistor chip 52A is die-bonded at the conductive pattern 51A, and passive element 52B such as a chip capacitor or a chip transistor is fixed with brazing material such as solder or conductive paste 55B.

A third process of the invention is to wire-bond an electrode of the circuit element 52 of each mounting portion 65 and the desired conductive pattern 51 as shown in FIG. 6A to FIG. 8B.

In the process, emitter electrode of the bare transistor chip 52A on each mounting portion in the block 62 and the conductive pattern 51A, and base electrode of the bare transistor chip 52A and conductive pattern 51B are wire-bonded in a lump by ball-bonding using thermocompression and wedge-bonding using ultrasonic waves.

The process has a problem that heating time becomes long and the conductive foil 60 oxidizes because wire bonding of whole mounting portions in the block 62 is performed continuously. Then in the invention, the problem is solved by blowing nitrogen gas to the conductive foil 60 from the clamper 70 continuously while wire bonding in the block 62.

Figure 7A:
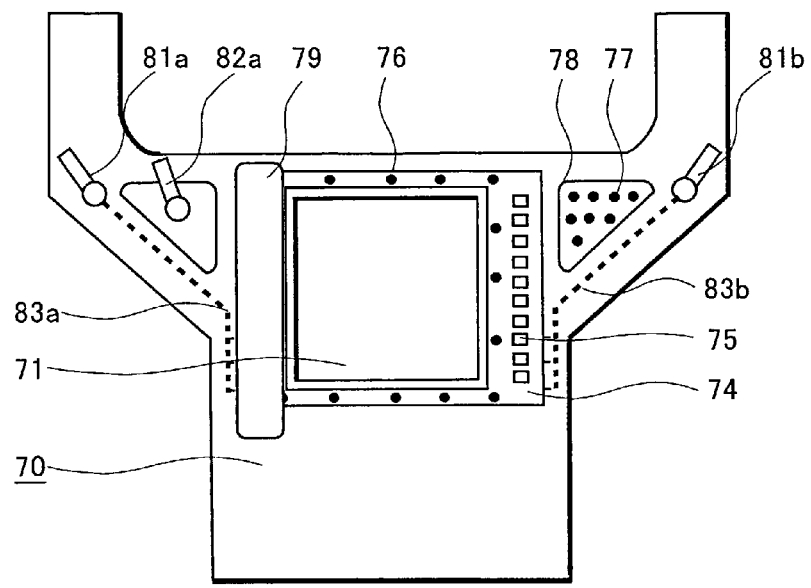
FIGS. 7A and 7B are views explaining a method of manufacturing a circuit device of the invention.
Figure 7B:
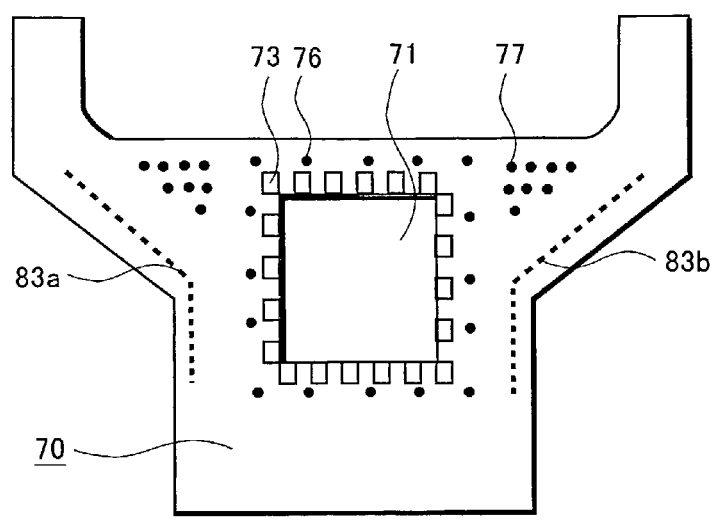

First, a shape of the clamper 70 using at the process will be described referring FIGS. 7A and 7B. FIG. 7A is an front plan view of the clamper 70, and FIG. 7B is a rear plan view.

The clamper 70 has an opening portion 71 almost same size as the block 62, and wire bonding is performed from the front side of the clamper through the opening portion 71 by a wire-bonder (not shown).

Further inlets 81 and 82 for injecting nitrogen are provided at the clamper 70. Nitrogen gas injected from the inlets 81a and 82b flows in to a concave portion 74 provided at periphery of the opening portion 71 through paths 83a and 83b provided in the clamper 70. Then, the gas jets out to lower side of the clamper from holes 76 provided so as to surround the opening portion 71 at inside of the concave portion 74. Here, the concave portion 74 is shown with hatching of points in the figure. The holes 76 are shown with black circles and go through to the rear face of the clamper.

Further, in FIG. 7A, covers 79 are attached at both sides of the concave portion 74. By attaching the covers 79 on the upper portion of the concave portion 74, the concave portion 74 can be used as a flowing path. FIG. 7A is shown at the state removing the cover 79 of right side for reason of the figure.

On the other hand, the nitrogen gas injected from an inlet 82a jets out to lower side of the clamper from holes 77 at inside of a concave portion 78 provided at lower side thereof. Here, FIG. 7A is shown at the state removing the cover 79 of right side.

Referring FIG. 7B, uneven portions 73 are provided at a part contacting the conductive foil 60 of the rear face of the clamper 70. The uneven portions 73 have operation letting the rear face of the block 62 adhere to a heat block by pressing surrounding end of the block 62. Space of the uneven portion 73 has operation letting nitrogen gas flow to inside of the opening portion.

Next, a method of wire bonding while blowing nitrogen gas to the conductive foil 60 will be described referring FIGS. 8A and 8B.

Figure 8A:
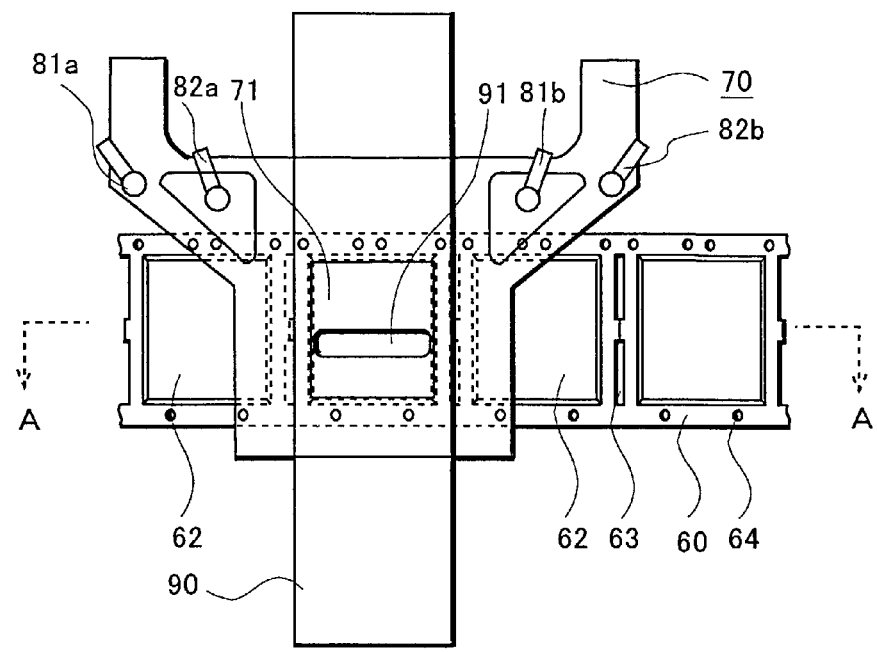
FIGS. 8A and 8B are views explaining a method of manufacturing a circuit device of the invention.
Figure 8B:
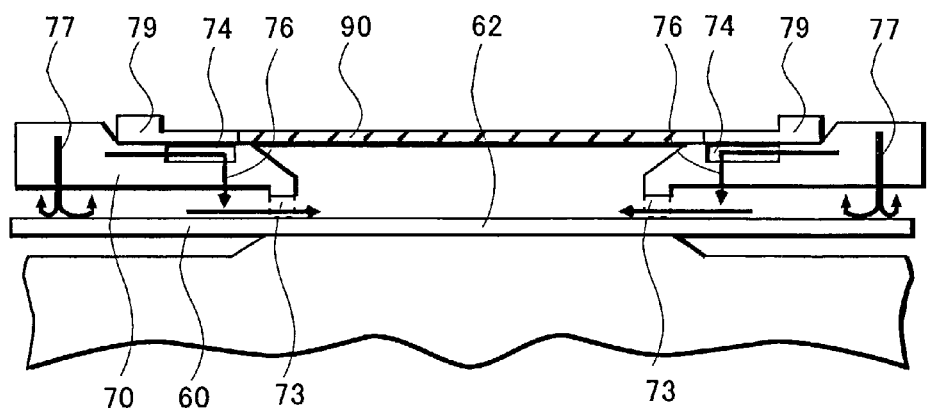

FIG. 8A is a plan view at wire bonding using the clamper 70 and FIG. 8B is a sectional view cut by A-A line of FIG. 8A.

Referring FIG. 8A, the clamper 70 presses a peripheral portion of one block 62 of the conductive foil 60. Further, a stainless plate 90 is mounted to cover the opening portion 71 of the clamper. An operation hole 91 for wire bonding by a wire-bonder (not shown) is provided at the plate 90. By mounting the plate 90 on the clamper 70, whole area of the upper side of the concave portion 74 is covered a cover 79 and the plate 90. Therefore, the concave portion 74 can be used as a path of nitrogen gas.

Referring FIG. 8B, a part of nitrogen gas blowing out to lower side from holes 76 and 77 moves to direction of the block 62. The gas passes a gap of the uneven portion 73 of the clamper, and reaches the surface of the block. At upper side of the block 62, a space is formed with the clamper 70 and plate 90. Therefore, the space is filled with the nitrogen gas, and the conductive foil of surface of the block 62 does not contact air.

By the above mentioned, oxidation of the conductive foil is prevented at performing wire bonding in the block 62 while heating the conductive foil. Therefore, in the process, wire bonding in the block can be performed in a lump.

Further, the rear face of the conductive foil 60 is substantially flat. Therefore, by pressing using the clamper at every block, the rear face of the conductive foil 60 can be bonded to a heat block. This is a feature of this process.

A fourth process is to cover the circuit element 52 of each mounting portion 63 in a lump and to common-mold with the insulating resin 50 so as to fill in the isolation trench 61.

Figure 9A:
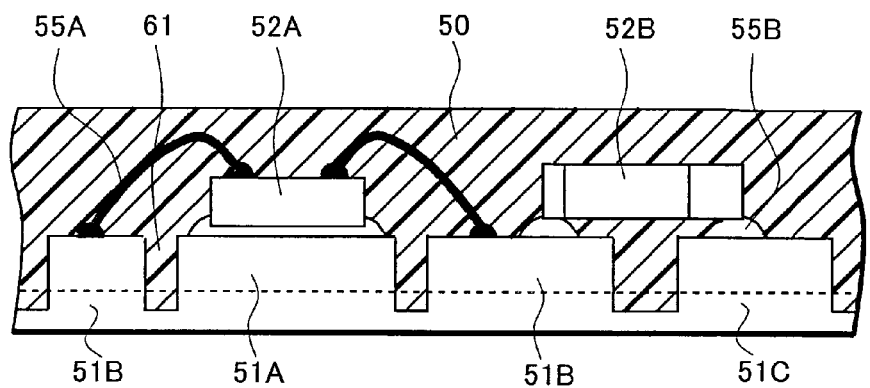
FIGS. 9A and 9B are views explaining a method of manufacturing a circuit device of the invention.

At the process, the insulating resin 50 covers entirely circuit elements 52A and 52B, and plural conductive patterns 51A, 51B, and 51C, and the insulating resin 50 connects strongly fixing to curved structures of side faces of the conductive patterns 51A, 51B, and 51C filled with the insulating resin 50 at the isolation trench 61 between conductive patterns 51 as shown in FIG. 9A. Then the conductive pattern 51 is supported by the insulation resin 50.

The process is realized by transfer molding, injection, or potting. For resin material, thermosetting resin such as epoxy resin etc. is realized by transfer molding, thermoplastic resin such as polyimide resin, polyphenylene sulphite, and the like is realized by injecting molding.

Figure 9B:
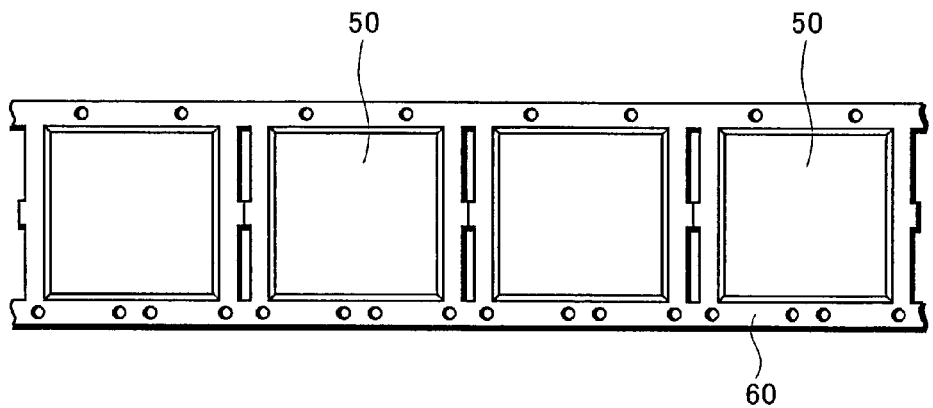

Further, at transfer molding or injecting molding in the process, the mounting portion 63 of each block 62 is stored in one common and molding is performed commonly at one insulating resin 50 at every block as shown in FIG. 9B. Because of that, quantity of resin is reduced sharply comparing with the conventional method of molding individual mounting portion.

Thickness of the insulating resin 50 covered on surface of the conductive foil 60 is adjusted so as to cover about 100 µm from the top portion of the metal fine wire 55A of the circuit element 52. It is possible to make the thickness thick or thin.

Figure 14:
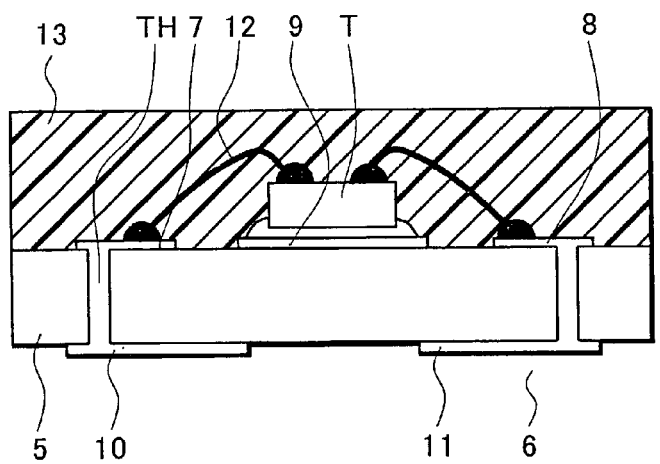
FIG. 14 is a view explaining a conventional circuit device.
Figure 15A:
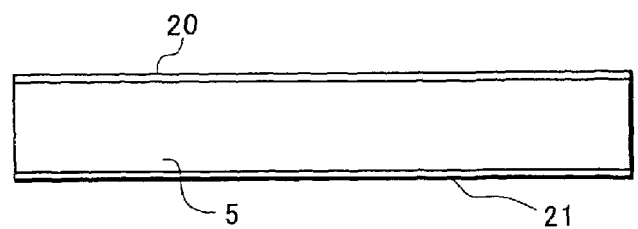
FIGS. 15A to 15D are views explaining a method of manufacturing a circuit conventional device.
Figure 15B:
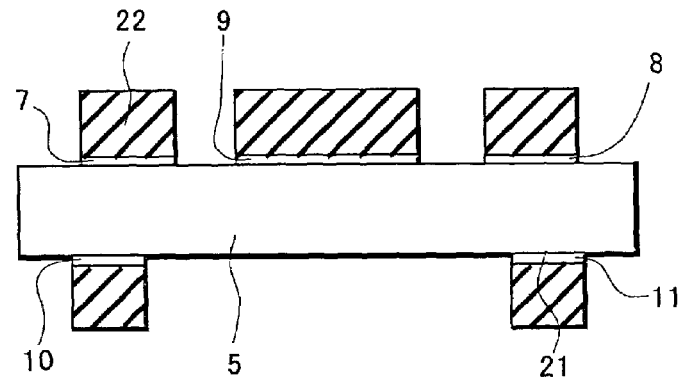
Figure 15C:
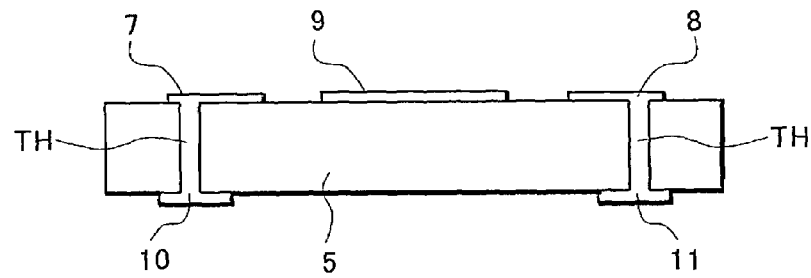
Figure 15D:
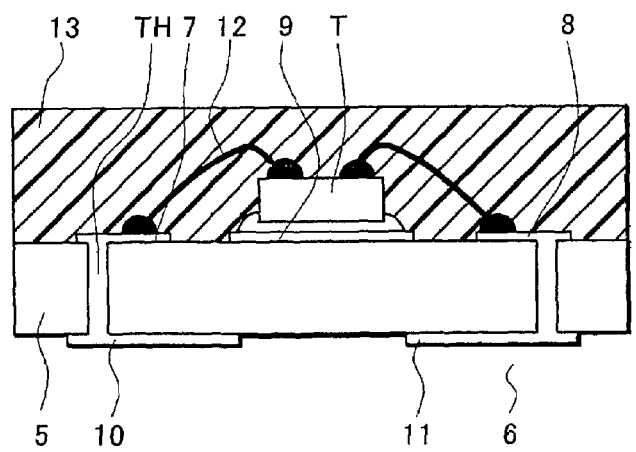
Figure 16:
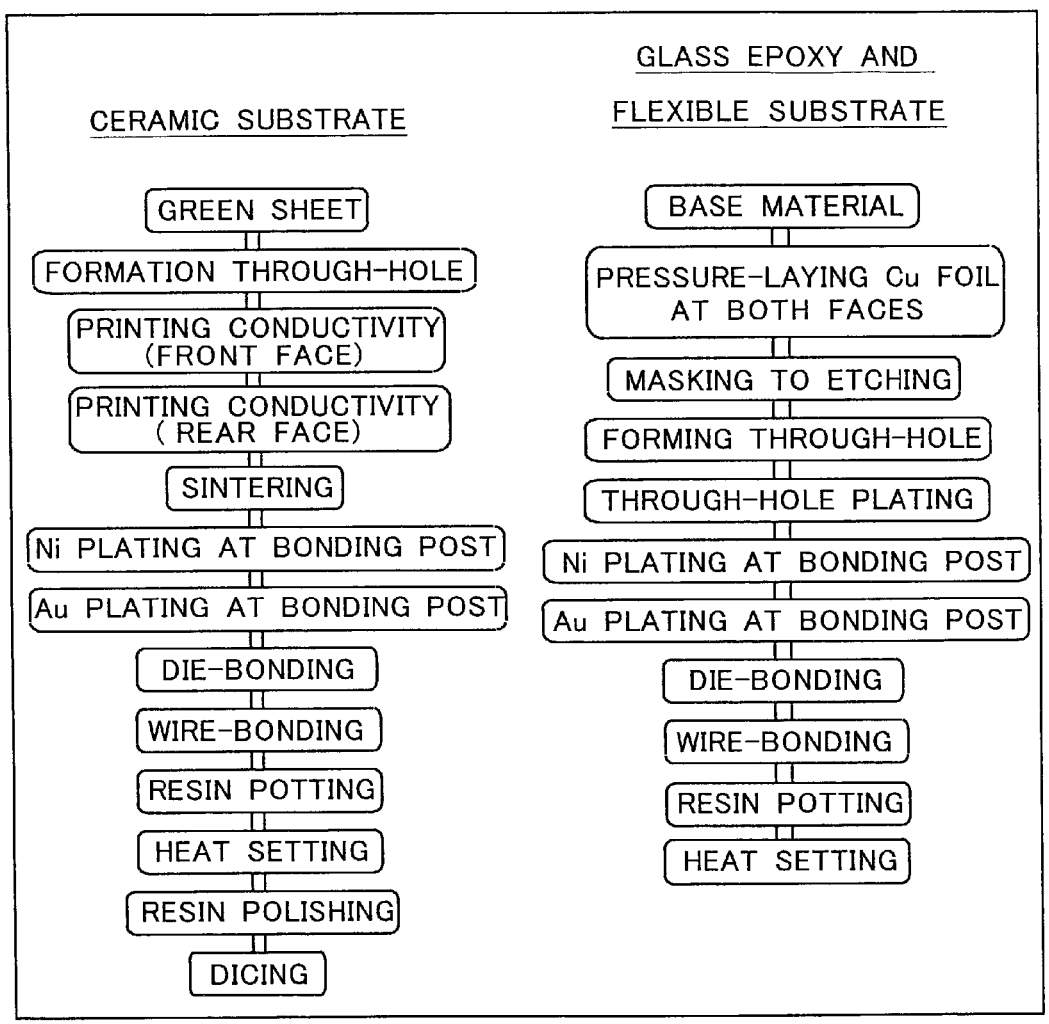
FIG. 16 is a view explaining a production flow of the related art.

According to this process, the conductive foil 60 becoming the conductive pattern 51 functions as a supporting substrate until the insulating resin 50 is covered. Although the conductive paths 7 to 11 are formed adopting the supporting substrate 5 needlessly originally up to now as shown in FIG. 14, the conductive foil 60 becoming the supporting substrate is material needing for electrode material in the invention. Because of that, the process has merit enabling to operate omitting component material as far as possible so as to realize cost reduction.

Since the isolation trench 61 is formed thinner than thickness of the conductive foil, the conductive foil 60 is not separated individually as the conductive pattern. Therefore, the conductive foil is treated in one body as the sheet shaped conductive foil 60 and that operation of transferring to the die and mounting to the die is very easy.

A fifth process of the invention is to remove whole area of the rear face of the conductive foil 60 until the insulating resin is exposed.

The process is to remove the rear face of the conductive foil 60 chemically and/or physically and separate as the conductive pattern 51. The process is performed by polishing, grinding, etching, metal evaporation of laser, and the like.

At experiment, whole face is ground about 30 µm by a polishing machine or a grinding machine so as to expose the insulating resin 50 from the isolation trench 61. The exposed face is shown with a dotted line in FIG. 9A. As the result, the conductive foil is separated becoming the conductive pattern 51 of about 40 µm thickness. The entire rear face of conductive foil 60 is wet-etched before the insulating resin 50 is exposed, after that the entire rear face is ground by a polishing machine or a grinding machine, and the insulating resin 50 may be exposed. Further, the insulating resin 50 may be exposed wet-etching whole face of the conductive foil 60 to position shown with a dotted line.

As the result, the rear face of the conductive pattern 51 is exposed at the insulating resin 50. That is, the surface of the insulating resin 50 and the surface of the conductive pattern 51 filled in the isolation trench 61 are same substantially. Therefore, the circuit device 53 of the invention has a feature enable to self-align moving horizontally as it is by surface tension of solder etc. at mounting because difference in level are not provided like the conventional rear face electrodes 10 and 11 shown in FIG. 14.

Figure 10:
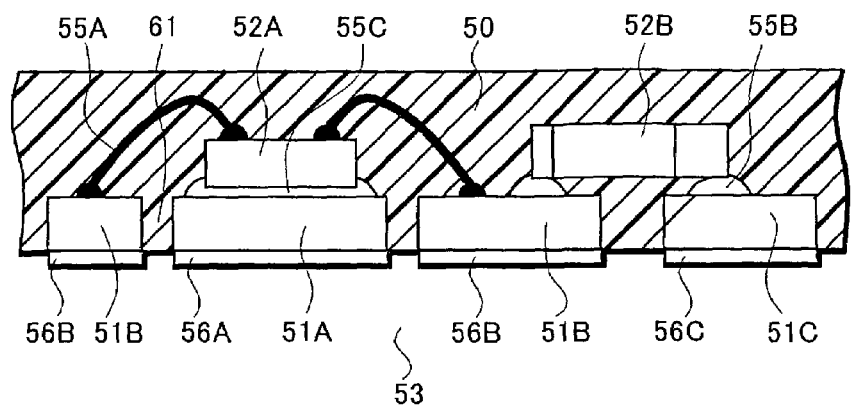
FIG. 10 is a view explaining a circuit device of the invention.

Further, performing rear face treatment of the conductive pattern 51, a final structure shown in FIG. 10 is obtained. That is, conductive material of solder etc. is covered on the exposed conductive pattern 51 if necessary, and the circuit device is completed.

Figure 11:
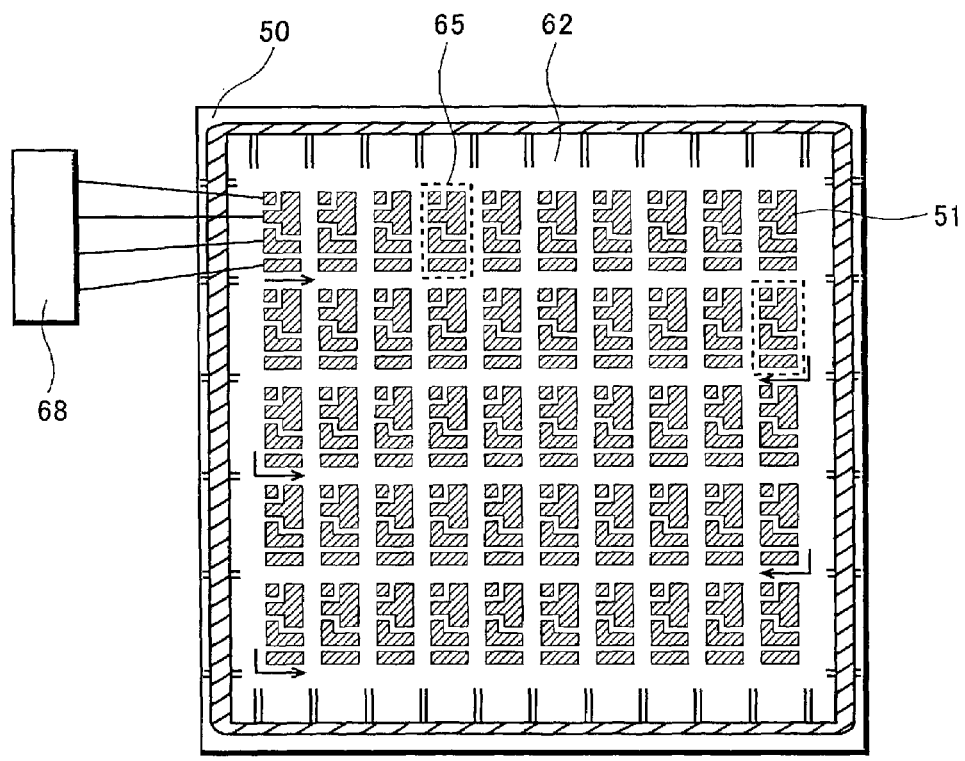
FIG. 11 is a view explaining a method of manufacturing a circuit device of the invention.

A sixth process of the invention is to perform test of property of the circuit device 52 of each mounting portion 63 molded with the insulating resin 50 in a lump as shown in FIG. 11.

After rear-etching the conductive foil 60 at former process, each block 62 is separated from the conductive foil 60. Since the block 62 is connected to the remained portion of the conductive foil 60 at the insulating resin 50, the block can be peeled off from the remained portion of the conductive foil 60 mechanically without using a cutting die.

The rear faces of the conductive patterns 51 are exposed at the rear face of each block 62, and each mounting portion 65 is arranged in matrix shape in the entirely same way as forming the conductive pattern 51 as shown in FIG. 11. Applying a probe 68 to the rear face electrode 56 exposed from the insulating resin 50 of the conductive pattern 51, judgement of good quality or not is performed by testing individually characteristic parameter and the like of the circuit device 52 on each mounting portion 65, and marking is performed for bad quality with magnetic ink and the like.

In the process, since the circuit device 53 of each mounting portion 65 is supported by the insulating resin 50 in one body at every block 62, it is not separated individually disconnectedly. Therefore, by pitch-feeding the block 62 set at a mounting table of a tester for size of the mounting portion 65 to longitudinal direction and lateral direction like as arrow sign, test of large quantity of the circuit devices 53 of each mounting portion 65 of the block 62 is performed very rapidly. That is, judgement of two-faces and recognition of position of electrode of the circuit device needing in the related art becomes needless, and plural blocks 62 are processed at the same time so as to design sharp shortening of testing time.

Although test of the property is performed before separating to individual circuit device by dicing in the process, it is possible to perform test of the property after dicing as the circuit device is in the state bonded at the sheet even when dicing is performed in the invention.

Figure 12:
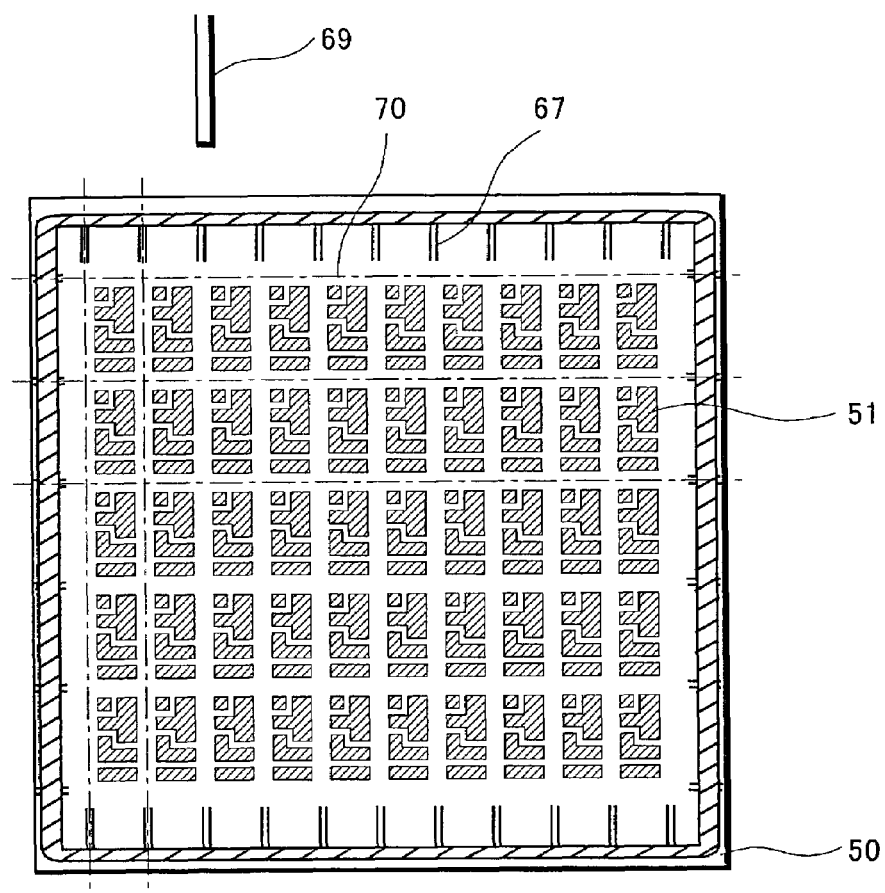
FIG. 12 is a view explaining a method of manufacturing a circuit device of the invention.

A seventh process of the invention is to separate the insulating resin 50 at every mounting portion 65 by dicing as shown in FIG. 12.

In the process, blocks 62 are absorbed on the mounting table of the dicing machine by vacuum, and the insulating resin 50 of the isolation trench 61 along the dicing line 70 between each mounting portions 65 by a dicing blade 69 so as to separate to individual circuit device 53.

In the process, the cutting depth of the dicing blade 69 is almost depth cutting the insulating resin 50, the device may be chocolate-broken with a roller after taking out the block 62 form the dicing machine. Facing positioning marks 67 of inside of frame shaped pattern 66 at periphery of each block provided at the above-mentioned first process is recognized previously at dicing are recognized, dicing is performed making the recognition standard. Dicing of lateral direction is performed letting the mounting table rotate 90 degrees after dicing all to longitudinal direction though it is well known.

In the invention, the conductive foil itself being conductive pattern material is functioned as a supporting substrate, whole conductive foil is supported by the conductive foil till forming the isolation trench, mounting the circuit element, and covering the insulating resin, and when the conductive foil is separated as each conductive pattern, the insulating resin is functioned as a supported substrate. Therefore, the circuit device can be produced by the minimum of the circuit element, the conductive foil, and the insulating resin required. The supporting substrate at constructing the circuit device originally is needless as described in the example of the related art so as to become low in cost. By that the supporting substrate is needless, the conductive pattern is buried in the insulating resin, and further adjustment of thickness the insulating resin and the conductive foil is possible, there is a merit forming a very thin circuit device.

Further, in the invention, since circumference end of the block using the clamper is pressed once and wire bonding between each circuit element of whole of the block and the desired conductive pattern is performed in a lump with heating the block at the wire bonding process, accuracy of size and position of the guide hole is low at the efficient mass production is possible. Since nitrogen gas is blown to the block from the clamper, oxidation of the conductive foil caused by heating at wire bonding is prevented.

Figure 13:
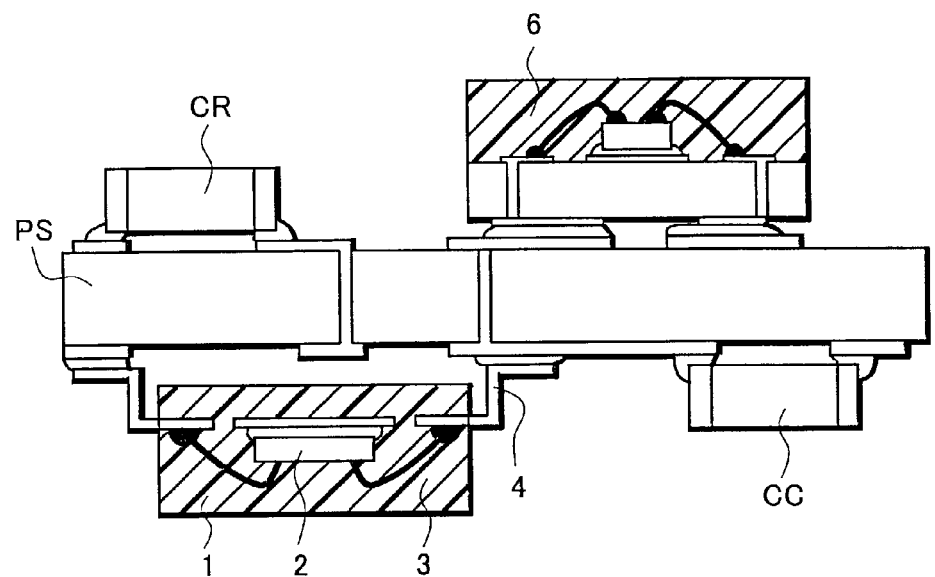
FIG. 13 is a view explaining a method of mounting a conventional circuit device.

As clear from FIG. 13, since the process forming the through-hole, the process printing conductivity (in the case of ceramic substrate), and the like are omitted, the invention advantages making product process sharply shorter than the related art and making whole process at inside of line. Further, the invention does not need any frame die so as to have a method of manufacturing of very short time.

What is claimed is:

1. A method of manufacturing a circuit device comprising the steps of:
   providing a sheet member including a plurality of blocks which are aligned with each other, each block including mounting portions arranged in a matrix, each mounting portion having a conductive pattern for mounting circuit elements;
   fixing the circuit elements onto a mounting portion having a conductive pattern;
   providing one of the blocks on a supporting member;
   pressing a periphery of the one of the blocks with a clamper;
   wire-bonding each of the circuit elements to a desired conductive pattern;
   common-molding with an insulation resin such that the circuit elements on the mounting portion are covered in a lump; and
   dicing the insulating resin to separate each of the mounting portions.

2. The method of manufacturing a circuit device as claimed in claim 1, wherein said insulating resin is transfer molded.

3. The method of manufacturing a circuit device as claimed in claim 1, wherein dicing is performed using an adjusting mark formed with said conductive pattern.

4. The method of manufacturing a circuit device as claimed in claim 1, wherein dicing is performed using pairs of adjusting marks facing each other formed with said conductive pattern.

5. The method of manufacturing a circuit device as claimed in claim 1, wherein said sheet member includes any one of copper, aluminum, and Fe—Ni.

6. The method of manufacturing a circuit device as claimed in claim 1, wherein said circuit elements include at least one of a semiconductor bare chip and a chip circuit part.

7. The method of manufacturing a circuit device according to claim 1:
   wherein the sheet member is provided with an isolation trench having a depth that is shallower than a thickness of the sheet member, the isolation trench being formed at an area of the sheet member other than an area associated with the conductive pattern; and
   wherein the method comprises the steps of:
     filling the insulating resin into the isolation trench; and
     removing a whole rear face of the sheet member until the insulating resin is exposed.

8. The method of manufacturing a circuit device as claimed in claim 1, wherein said supporting member is in contact with said conductive pattern continuously until wire bonding each of the circuit elements to a desired conductive pattern is substantially completed.

9. The method of manufacturing a circuit device as claimed in claim 1, wherein an upper portion of an opening portion of said clamper is covered by a metal plate, and said clamper and said metal plate form a space filled with nitrogen gas over said block.

10. The method of manufacturing a circuit device as claimed in claim 1, wherein said plurality of block are arranged at said sheet member.

11. The method of manufacturing a circuit device as claimed in claim 1, wherein at least a part of the surface of said sheet member is covered by a conductive film.

12. The method of manufacturing a circuit device as claimed in claim 8, wherein the wire bonding each circuit element to a desired conductive pattern is performed by pressing a surrounding end of said block at an uneven portion provided at said clamper.

13. The method of manufacturing a circuit device as claimed in claim 12, wherein the wire-bonding is performed by feeding nitrogen gas to a whole area of said block through said uneven portion.

14. The method of manufacturing a circuit device according to claim 13, wherein a path for flowing said nitrogen gas is provided at an inside of said clamper.

15. The method of manufacturing a circuit device as claimed in claim 9, wherein an operating hole is provided at said metal plate, and wire bonding is performed through said operating hole.

16. The method of manufacturing a circuit device as claimed in claim 10, wherein said insulating resin is transfer molded at every block.

17. The method of manufacturing a circuit device according to claim 11, wherein said conductive film is formed with any one of nickel plating, gold plating, and silver plating.

* * * * *